US 7,750,697 B2

(12) United States Patent
Feng

(10) Patent No.: US 7,750,697 B2
(45) Date of Patent: Jul. 6, 2010

(54) FRACTIONAL-N PHASED-LOCK-LOOP (PLL) SYSTEM

(75) Inventor: Kai Di Feng, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/176,500

(22) Filed: Jul. 21, 2008

(65) Prior Publication Data

US 2009/0243674 A1 Oct. 1, 2009

Related U.S. Application Data

(63) Continuation-in-part of application No. 12/060,162, filed on Mar. 31, 2008, now Pat. No. 7,472,362.

(51) Int. Cl.
*H03L 7/06* (2006.01)
(52) U.S. Cl. ...................................... 327/157; 327/147
(58) Field of Classification Search ................ 327/147, 327/157
See application file for complete search history.

(56) References Cited

U.S. PATENT DOCUMENTS

| | | | | | |
|---|---|---|---|---|---|
| 1,957,752 | A | * | 5/1934 | Avery | 455/341 |
| 3,739,270 | A | * | 6/1973 | Miller et al. | 324/166 |
| 4,087,757 | A | * | 5/1978 | Cunningham | 334/40 |
| 4,363,138 | A | | 12/1982 | Franklin et al. | 455/226.2 |
| 5,032,839 | A | * | 7/1991 | Even-Or | 342/15 |
| 5,041,745 | A | * | 8/1991 | Raso | 327/50 |
| 5,909,661 | A | | 6/1999 | Ambramovitch et al. | |
| 6,008,821 | A | * | 12/1999 | Bright et al. | 345/504 |
| 6,298,046 | B1 | * | 10/2001 | Thiele | 370/282 |
| 6,327,542 | B1 | | 12/2001 | McBride | |
| 6,388,480 | B1 | * | 5/2002 | Stubbs et al. | 327/156 |
| 6,404,276 | B1 | * | 6/2002 | Liu | 327/553 |
| 6,686,809 | B2 | * | 2/2004 | Nystrom et al. | 333/17.1 |
| 6,724,846 | B1 | * | 4/2004 | Lo | 375/354 |

(Continued)

FOREIGN PATENT DOCUMENTS

JP 04234211 A * 8/1992

OTHER PUBLICATIONS

Kim, "A Fractional-N-PLL Frequency Synthesizer Design" 2005 IEEE.

(Continued)

*Primary Examiner*—Lincoln Donovan
*Assistant Examiner*—Adam D Houston
(74) *Attorney, Agent, or Firm*—Zilka-Kotab, PC

(57) ABSTRACT

In one general embodiment, a fractional-N phased-lock-loop (PLL) structure comprises a first circuit located on an integrated circuit, where the first circuit includes a voltage controlled oscillator for generating a periodic output signal, a phase detector for controlling the voltage controlled oscillator, a charge pump for modifying an input to the voltage controlled oscillator, a frequency divider in a feedback path for modifying a frequency of the output signal, a first multiplexer, and a first random number generator. The fractional-N phased-lock-loop (PLL) structure further comprises a second circuit including a second multiplexer and a second random number generator, wherein the second circuit is a programmable circuit located off the integrated circuit and coupled to the first circuit. Additional systems and structures are also presented.

18 Claims, 5 Drawing Sheets

U.S. PATENT DOCUMENTS

| | | | |
|---|---|---|---|
| 6,813,484 B1 * | 11/2004 | Tolson | 455/307 |
| 6,842,069 B2 * | 1/2005 | Takahashi et al. | 327/552 |
| 6,915,503 B1 | 7/2005 | Lesea | |
| 7,092,678 B2 * | 8/2006 | Shih | 455/78 |
| 7,109,781 B2 * | 9/2006 | Vorenkamp et al. | 327/513 |
| 7,120,412 B2 | 10/2006 | Anand | |
| 7,181,711 B2 | 2/2007 | Foreman et al. | 716/6 |
| 7,183,860 B2 | 2/2007 | Staszewski et al. | |
| 7,245,186 B2 * | 7/2007 | Chang et al. | 330/302 |
| 7,260,368 B1 * | 8/2007 | Blumer | 455/108 |
| 7,277,805 B2 * | 10/2007 | Foster et al. | 702/69 |
| 7,288,998 B2 | 10/2007 | Thomsen et al. | |
| 7,292,947 B1 | 11/2007 | Tabatabaei | 702/69 |
| 7,295,077 B2 | 11/2007 | Thomsen et al. | |
| 7,301,392 B2 * | 11/2007 | Hinrichs et al. | 327/553 |
| 7,310,593 B2 | 12/2007 | Hammerschmidt | 702/189 |
| 7,313,176 B1 | 12/2007 | Groen | |
| 7,321,847 B1 | 1/2008 | Welkie et al. | 702/199 |
| 7,339,442 B2 * | 3/2008 | Godambe | 331/135 |
| 7,365,580 B2 * | 4/2008 | Martin et al. | 327/156 |
| 7,446,600 B2 * | 11/2008 | Kosai | 327/553 |
| 7,471,142 B2 * | 12/2008 | Li et al. | 327/552 |
| 2003/0224747 A1 | 12/2003 | Anand | |
| 2004/0210790 A1 * | 10/2004 | Moon et al. | 713/500 |
| 2005/0107970 A1 | 5/2005 | Franch et al. | 702/79 |
| 2005/0111536 A1 | 5/2005 | Cranford et al. | 375/226 |
| 2005/0186920 A1 | 8/2005 | Staszewski et al. | |
| 2005/0246142 A1 | 11/2005 | Hammerschmidt | 702/189 |
| 2006/0033582 A1 | 2/2006 | Staszewski et al. | |
| 2006/0202714 A1 | 9/2006 | Hoang et al. | |
| 2006/0209216 A1 * | 9/2006 | Okuma | 348/725 |
| 2006/0245531 A1 | 11/2006 | Leonowich et al. | |
| 2006/0248485 A1 | 11/2006 | Foreman et al. | 716/6 |
| 2006/0273870 A1 * | 12/2006 | Yeung et al. | 333/204 |
| 2007/0064663 A1 * | 3/2007 | Dahlfeld | 370/338 |
| 2007/0100596 A1 | 5/2007 | Hollis | 703/14 |
| 2007/0103240 A1 | 5/2007 | Staszewski et al. | |
| 2007/0161357 A1 * | 7/2007 | Tudosoiu et al. | 455/129 |
| 2007/0200628 A1 * | 8/2007 | Leete | 330/254 |
| 2007/0205833 A1 | 9/2007 | Mar et al. | |
| 2007/0233444 A1 | 10/2007 | O'Mahony et al. | 703/14 |
| 2008/0008320 A1 * | 1/2008 | Hinton et al. | 380/263 |
| 2008/0136473 A1 * | 6/2008 | Bollenbeck et al. | 327/156 |
| 2008/0238626 A1 * | 10/2008 | Rofougaran et al. | 340/10.1 |
| 2008/0244491 A1 * | 10/2008 | Ganesan et al. | 716/10 |
| 2009/0002915 A1 * | 1/2009 | Ayazi et al. | 361/287 |
| 2009/0015304 A1 * | 1/2009 | Yin et al. | 327/162 |

OTHER PUBLICATIONS

Wang, "A Generic Multi-Modulus Divider Architecture For Fractional-N Frequency Synthesisers" 2007 IEEE.

Notice of Allowance from U.S. Appl. No. 12/060,162 mailed on Jul. 10, 2008.

* cited by examiner

FRACTIONAL-N PHASED-LOCK-LOOP (PLL) SYSTEM

RELATED APPLICATION(S)

The present application is a continuation-in-part of U.S. patent application Ser. No. 12/060,162 filed Mar. 31, 2008, now U.S. Pat. No. 7,472,362 which is incorporated herein by reference in its entirety for all purposes.

This application is related to U.S. patent application Ser. No. 12/176,530 to the same inventor, filed concurrently herewith and having title "OPTIMIZATION METHOD FOR FRACTIONAL-N PHASED-LOCK-LOOP (PLL) SYSTEM" and is also related to U.S. patent application Ser. No. 12/176,536 to the same inventor, filed concurrently herewith and having title "DESIGN STRUCTURE FOR FRACTIONAL-N PHASED-LOCK-LOOP (PLL) SYSTEM."

BACKGROUND OF THE INVENTION

The present invention relates to circuits, and more particularly, this invention relates to fractional-N PLL circuits and highly efficient development and/or optimization methods therefor.

The integrated circuit of a fractional-N phased-lock-loop (PLL) is widely used in communication systems. Such circuits feature high frequency resolution without degrading locking time. The conventional fractional-N PLL needs a long development time for meeting specifications for two main performance criteria: phase noise and spur. Any modification to the circuits normally leads to a very long manufacture time. For example, one tape out usually may take three months or more in manufacture time.

It would be desirable to obtain the maximum information on determining the phase noise source, minimizing the phase noise, and reducing the spurs. Furthermore, it would be desirable to find the phase noise sources and determine the main phase noise source because of the multiple phase noise sources in the system. One source of the phase noise is from the algorithm of a random number generator. Often, the random number generator uses an algorithm called MASH (multiple stage noise shaping) to shape the noise to a high frequency. A loop filter is then expected to filter out the noise.

In some cases, the random number generator may be a digital circuit which generates wide band noise which couples to the other part of the PLL through a power supply and substrate. Finding the actual source of the noise, however, is very difficult. There is thus a need for addressing these and/or other issues associated with the prior art.

BRIEF SUMMARY OF THE INVENTION

In one general embodiment, a fractional-N phased-lock-loop (PLL) structure comprises a first circuit located on an integrated circuit, where the first circuit includes a voltage controlled oscillator for generating a periodic output signal, a phase detector for controlling the voltage controlled oscillator, a charge pump for modifying an input to the voltage controlled oscillator, a frequency divider in a feedback path for modifying a frequency of the output signal, a first multiplexer, and a first random number generator. The fractional-N phased-lock-loop (PLL) structure further comprises a second circuit including a second multiplexer and a second random number generator, wherein the second circuit is a programmable circuit located off the integrated circuit and coupled to the first circuit.

In another general embodiment, a system comprises a first circuit located on an integrated circuit, where the first circuit includes a first multiplexer and a first random number generator. The system further comprises a second circuit including a second multiplexer and a second random number generator, wherein the second circuit is a programmable circuit located off the integrated circuit and coupled to the first circuit. Furthermore, the system is utilized to measure a phase noise of a phased-lock-loop (PLL) circuit.

Other approaches and embodiments of the present invention will become apparent from the following detailed description, which, when taken in conjunction with the drawings, illustrate by way of example the principles of the invention.

DETAILED DESCRIPTION

Figure 1:
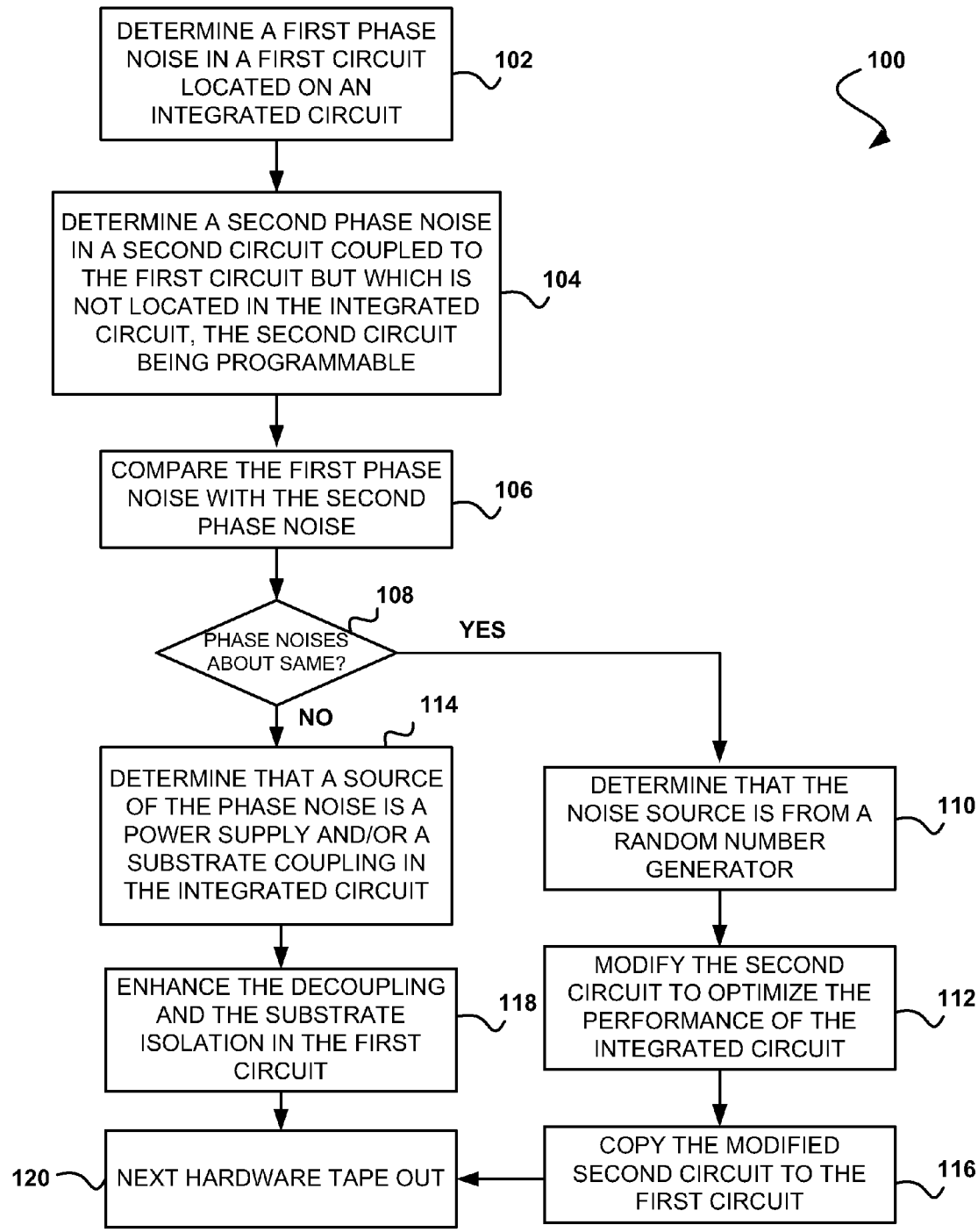
FIG. 1 shows a method for determining a source of phase noise in a circuit, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In one general embodiment, a method is provided. In operation, a first phase noise in a first circuit located on an integrated circuit is determined. Additionally, a second phase noise in a second circuit coupled to the first circuit but which is not located in the integrated circuit is determined, the second circuit being programmable. Furthermore, the first phase noise is compared with the second phase noise. If the phase noises are about the same, it is determined that the noise source is from an algorithm of a random number generator and the algorithm of the second circuit is modified to shape the random number spectrum to the high frequency further more and to optimize the other performances of the integrated circuit, for example, spur. Then the optimized second circuit is copied to the first circuit for the next hardware tape out. If the phase noises are different, it is determined that a source of the phase noise is a power supply and/or the substrate coupling in the integrated circuit. Then the decoupling of the power supply and substrate isolation should be enhanced for the next hardware tape out.

In another general embodiment, a method is provided. In operation, a first phase noise in a first circuit located on an integrated circuit is determined. Additionally, a second phase noise in a second circuit coupled to the first circuit but which is not located in the integrated circuit is determined, the second circuit being programmable. Furthermore, the first phase noise is compared with the second phase noise. Also, the second circuit is conditionally modified to optimize the performance of the integrated circuit, based on a result of the comparison.

In another general embodiment, a method is provided. In operation, a first phase noise in a first circuit located on an integrated circuit is determined. Additionally, a second phase noise in a second circuit coupled to the first circuit but which is not located in the integrated circuit is determined, the second circuit being programmable. Furthermore, the first phase noise is compared with the second phase noise. Also, the second circuit is conditionally modified to optimize the performance of the integrated circuit, based on a result of the comparison. Further, the first circuit includes a voltage controlled oscillator for generating a periodic output signal, a phase detector for controlling the voltage controlled oscillator, a charge pump for modifying an input to the voltage controlled oscillator, a frequency divider in a feedback path for modifying a frequency of the output signal, a first multiplexer, and a first random number generator. In addition, the second circuit includes a second multiplexer and a second random number generator.

In another general embodiment, a method is provided. In operation, a first phase noise in a first circuit located on an integrated circuit is determined. Additionally, a second phase noise in a second circuit coupled to the first circuit but which is not located in the integrated circuit is determined, the second circuit being programmable. Furthermore, the first phase noise is compared with the second phase noise and the second circuit is conditionally modified to optimize the performance of the integrated circuit, based on a result of the comparison. Also, the first circuit is conditionally modified to optimize the performance of the integrated circuit, based on a result of the comparison.

In another general embodiment, a fractional-N phased-lock-loop (PLL) structure comprises a first circuit located on an integrated circuit, where the first circuit includes a voltage controlled oscillator for generating a periodic output signal, a phase detector for controlling the voltage controlled oscillator, a charge pump for modifying an input to the voltage controlled oscillator, a frequency divider in a feedback path for modifying a frequency of the output signal, a first multiplexer, and a first random number generator. The fractional-N phased-lock-loop (PLL) structure further comprises a second circuit including a second multiplexer and a second random number generator, wherein the second circuit is a programmable circuit located off the integrated circuit and coupled to the first circuit.

In another general embodiment, a system comprises a first circuit located on an integrated circuit, where the first circuit includes a first multiplexer and a first random number generator. The system further comprises a second circuit including a second multiplexer and a second random number generator, wherein the second circuit is a programmable circuit located off the integrated circuit and coupled to the first circuit. Furthermore, the system is utilized to measure a phase noise of a phased-lock-loop (PLL) circuit.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

FIG. 1 shows a method 100 for determining a source of phase noise in a circuit, in accordance with one embodiment. As shown, a first phase noise in a first circuit located on an integrated circuit is determined. See operation 102. Determining the phase noise may entail simply identifying the phase noise; quantifying characteristics of the phase noise such as frequency, depth, etc.; etc.

Additionally, a second phase noise in a second circuit coupled to the first circuit but which is not located in the integrated circuit is determined, the second circuit being programmable. See operation 104. Furthermore, the first phase noise is compared with the second phase noise. See operation 106. If the phase noises are about the same, it is determined that the noise source is from a random number generator and the second circuit is modified to optimize the performance of the integrated circuit. See operations 108, 110, and 112. Furthermore, the modified second circuit is copied to the first circuit. See operation 116. Additionally, the decoupling of the power supply and substrate may also be enhanced for the next hardware tape out. See operation 120.

If the phase noises are different, it is determined that a source of the phase noise is a power supply and/or a substrate coupling in the integrated circuit and the decoupling in the first circuit is enhanced and implemented in the next hardware tape out. See operations 114, 118 and 120. In this way, a main noise source may be determined and eliminated from a power supply coupling and substrate coupling of a system.

Figure 2:
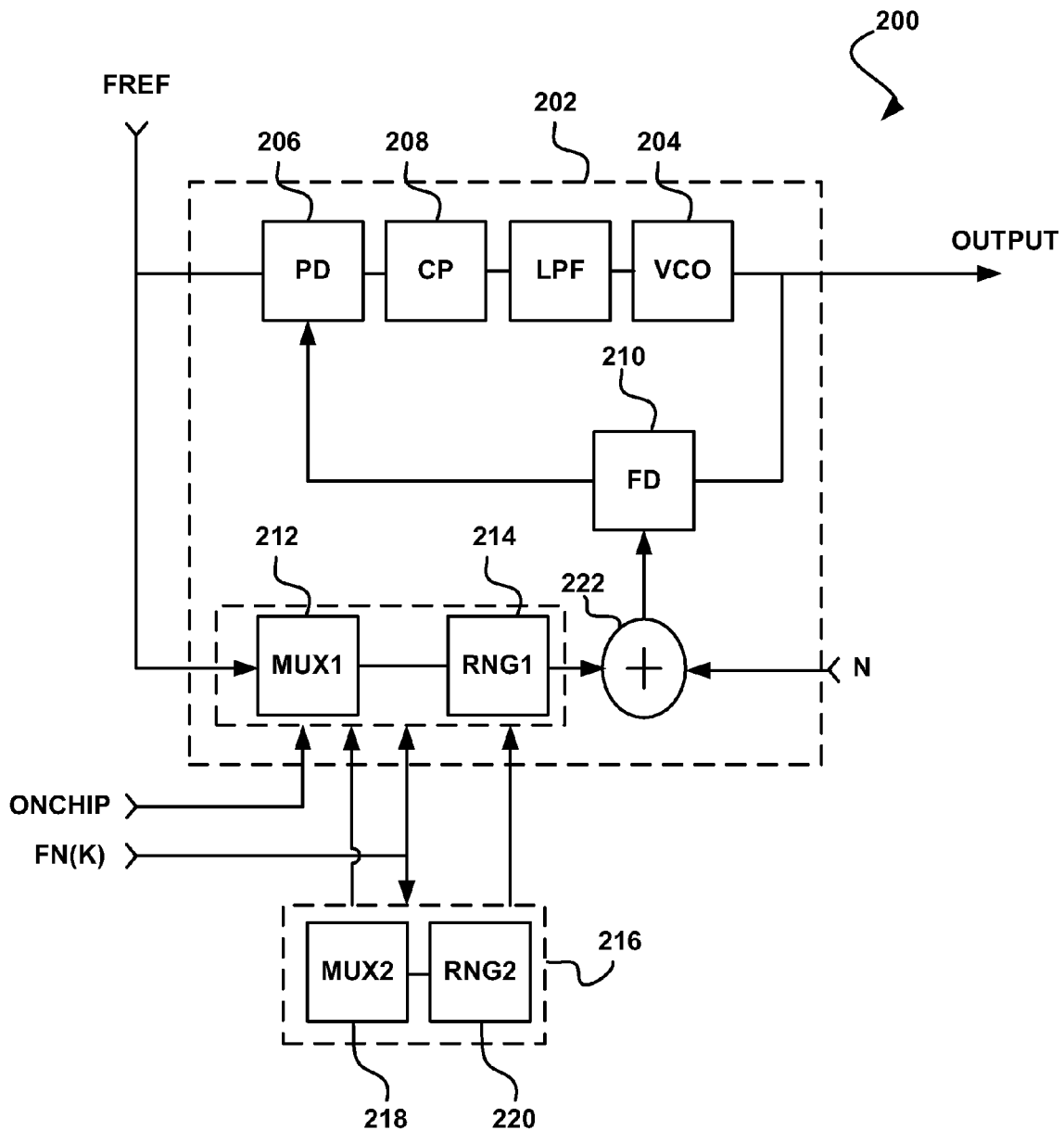
FIG. 2 shows a fractional-N phased-lock-loop (PLL) structure, in accordance with one embodiment.

FIG. 2 shows a fractional-N phased-lock-loop (PLL) structure 200, in accordance with one embodiment. As shown, the structure 200 comprises a first circuit 202 located on an integrated circuit. In this case, the first circuit includes a voltage controlled oscillator 204 for generating a periodic output signal, a phase detector 206 for controlling the voltage controlled oscillator 204, a charge pump 208 for modifying an input to the voltage controlled oscillator 204, a frequency divider 210 in a feedback path for modifying a frequency of the output signal, a first multiplexer 212 and a first random number generator 214. The fractional-N phased-lock-loop (PLL) structure 200 further comprises a second circuit 216 including a second multiplexer 218 and a second random number generator 220, wherein the second circuit 216 is a programmable circuit located off the integrated circuit and coupled to the first circuit 202.

Further, in one embodiment, the structure 200 may further include an adder circuit 222 coupled to the first random number generator 214 and/or a third multiplexer (not shown). The first circuit 202 may further include the third multiplexer. In this case, the third multiplexer may be coupled to the second circuit 216 and/or the first random number generator 214.

Additionally, in one embodiment, the second circuit 216 may be a field programmable gate array (FPGA). In this case, a first input of the FPGA may be coupled to the first random number generator 214 and/or a common signal going to the first random number generator 214 [e.g. a fractional N setting signal, FN(K)]. Additionally, a second input of the FPGA may be coupled to the first multiplexer 212. In another embodiment, a first output of the FPGA may be coupled to a third multiplexer.

It should be noted that, preferably, only one of the first or the second random number generators 214 and 220 operate at a given time. For example, at least the first and the second multiplexers 212 and 218 may be configured to switch operation between the first and the second random number generators 214 and 220. In another embodiment, at least the second multiplexer 218 and the third multiplexer may be configured to switch operation between the first and the second random number generators 214 and 220.

Further, in one embodiment, the digital circuitry of the first and the second random number generators 214 and 220 may be functionally the same at the beginning of operation. For example, the setting of the first and the second random number generators 214 and 220 may be the same. As another option, the first and the second random number generators 214 and 220 may be the same type of random number generator. For example, the first and the second random number generator 214 and 220 may be a type of random number generator that utilizes a multiple stage noise shaping (MASH) algorithm.

It should be noted that the first circuit 202 may be configured to measure phase noise, or configured to allow measurement of phase noise. Similarly, the second circuit 216 may be configured to measure phase noise, or configured to allow measurement of phase noise. In operation, a first phase noise measured by the first circuit 202 may be compared to a second phase noise measured by the second circuit 216. In another approach, the comparison can be performed by some other circuit or device, such as a tester coupled to the circuits, computer coupled to the circuits, etc. Subsequently, a main phase noise source may be determined based on the comparison, as described elsewhere herein.

Once the main phase noise source is determined, the first and/or the second circuit 202 and 216 may be conditionally modified based on the comparison. In one case, the first circuit 202 and/or the second circuit 216 may be modified to meet technical requirements, or technical specifications, based on the comparison. As an option, the modification may include modifying the second random number generator 220 to optimize performance of the structure 200.

For example, in one embodiment, the optimization may include optimizing phase noise and fractional spur associated with the structure 200. In this case, fractional spur refers to unwanted (spurious) sidebands, also called "reference spurs" which may reduce a capture range and/or a lock time of the structure 200. As an option, settings corresponding to the optimization may be implemented on the first random number generator 214. As another option, a subsystem may reprogram the second circuit 216, based on the comparison.

Figure 3:
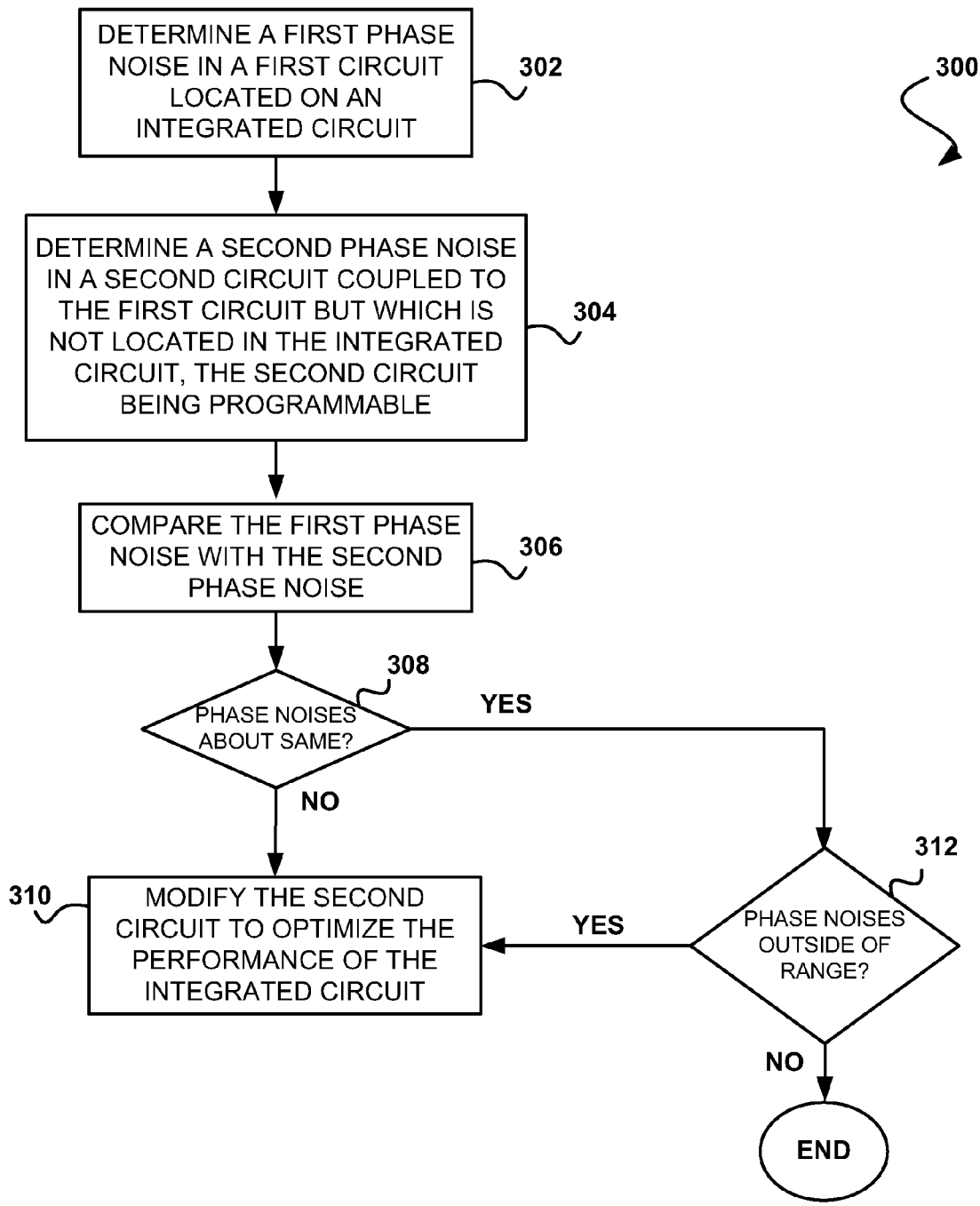
FIG. 3 shows a method for optimizing a performance of an integrated circuit of a fractional-N phased-lock-loop (PLL) structure, in accordance with one embodiment.

FIG. 3 shows a method 300 for optimizing a performance of an integrated circuit of a fractional-N phased-lock-loop (PLL) structure, in accordance with one embodiment. As shown, a first phase noise in a first circuit located on an integrated circuit is determined. See operation 302.

Additionally, a second phase noise in a second circuit coupled to the first circuit but which is not located in the integrated circuit is determined, the second circuit being programmable. See operation 304. Furthermore, the first phase noise is compared with the second phase noise. See operation 306.

If the first phase noise and the second phase noise are different, the second circuit is modified to optimize performance of the integrated circuit. See operation 310. If the first phase noise and the second phase noise are about equal, and a value of the first phase noise or the second phase is outside of an acceptable range, the second circuit is modified to optimize performance of the integrated circuit. See operation 312. In this way, a main noise source may be determined and eliminated from a power supply coupling and substrate coupling of a system.

Figure 4:
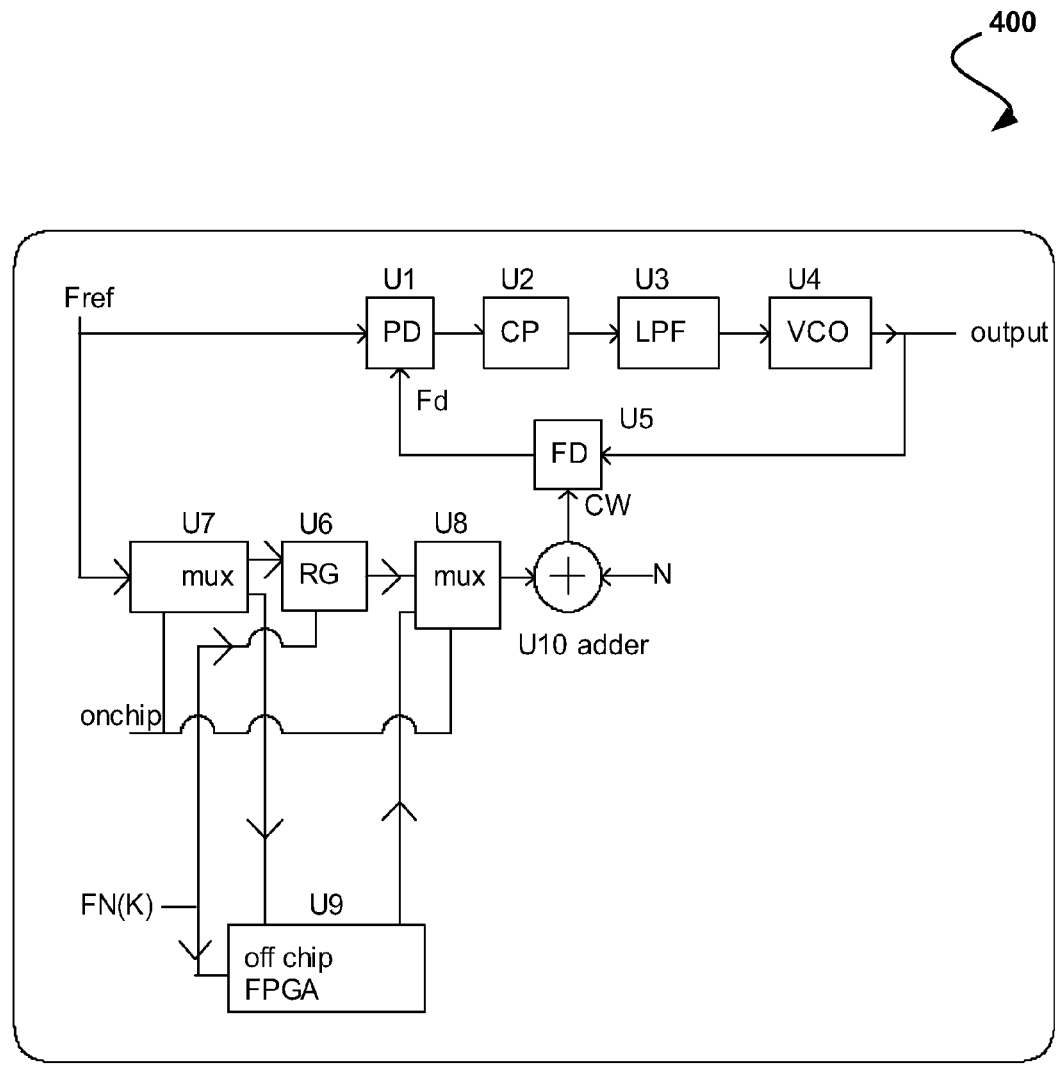
FIG. 4 shows a block diagram of a fractional-N phased-lock-loop (PLL) system, in accordance with another embodiment.

FIG. 4 shows a block diagram of a fractional-N phased-lock-loop (PLL) system 400, in accordance with one embodiment. As shown, a reference frequency "Fref," a phase detector (PD) U1, a charge pump (CP) U2, a filter (LPF) U3, a voltage controlled oscillator (VCO) U4, a frequency divider (FD) U5, and a random number generator (RG) U6 are provided. In normal operation, the random number generator generates a signed random number for each clock of Fref. FN(K) is a K bit input bus of the random number generator U6. When the bus is specified a number of L, the mean value of the random numbers approach $u=L/2^K$. The random number and a fixed integer N are added, and the sum is control word "CW" of frequency divider such that the frequency divide ratio is N.u and the output frequency Fout=N.u*Fref.

As shown further, an off chip field-programmable gate array (FPGA) U9 is provided. In this case, the FPGA is initially coded the same digital circuit as in the random number generator U6. Two digital multiplexers U7 and U8, under control of a mode control signal "onchip," are also provided. When the mode control signal "onchip" is at logic high, the random number generator U6 is activated, Fref is input to the random number generator U6, and a random number generator U6 output is connected to an adder U10. When "onchip" is at logic low, the random number generator U6 is completely inactivated while the FPGA U9 is activated, Fref is input to the FPGA U9, and the FPGA U9 output is connected to the adder U10. In this case, the power supply of FPGA U9 is separated from the fractional-N PLL and no substrate noise coupling between U9 and the rest circuits of the fractional-N PLL.

When the system 400 operates in off chip mode, there is no power supply or substrate coupling. Thus, the phase noise of the two modes may be measured. If the phase noise of the two modes is the same, the noise source is from the random number generator. The next step is to modify the code of the FPGA until the phase noise can meet the specification. If the phase noise of the two modes is different, the noise source is from the on chip power supply coupling and/or the substrate coupling, and the next step is enhance the decoupling of on chip power supply and the isolation of the layout. In this way, using the system 400, a main noise source may be determined and eliminated from a power supply and substrate.

Furthermore, by enabling and disabling the two random number generators, designers may be able to determine phase noise sources easily, thus shortening a system development period. Additionally, the system 400 provides the possibility for the designer to find an optimal random number generator or MASH setting without long integrated circuit foundry time and high foundry cost.

Figure 5:
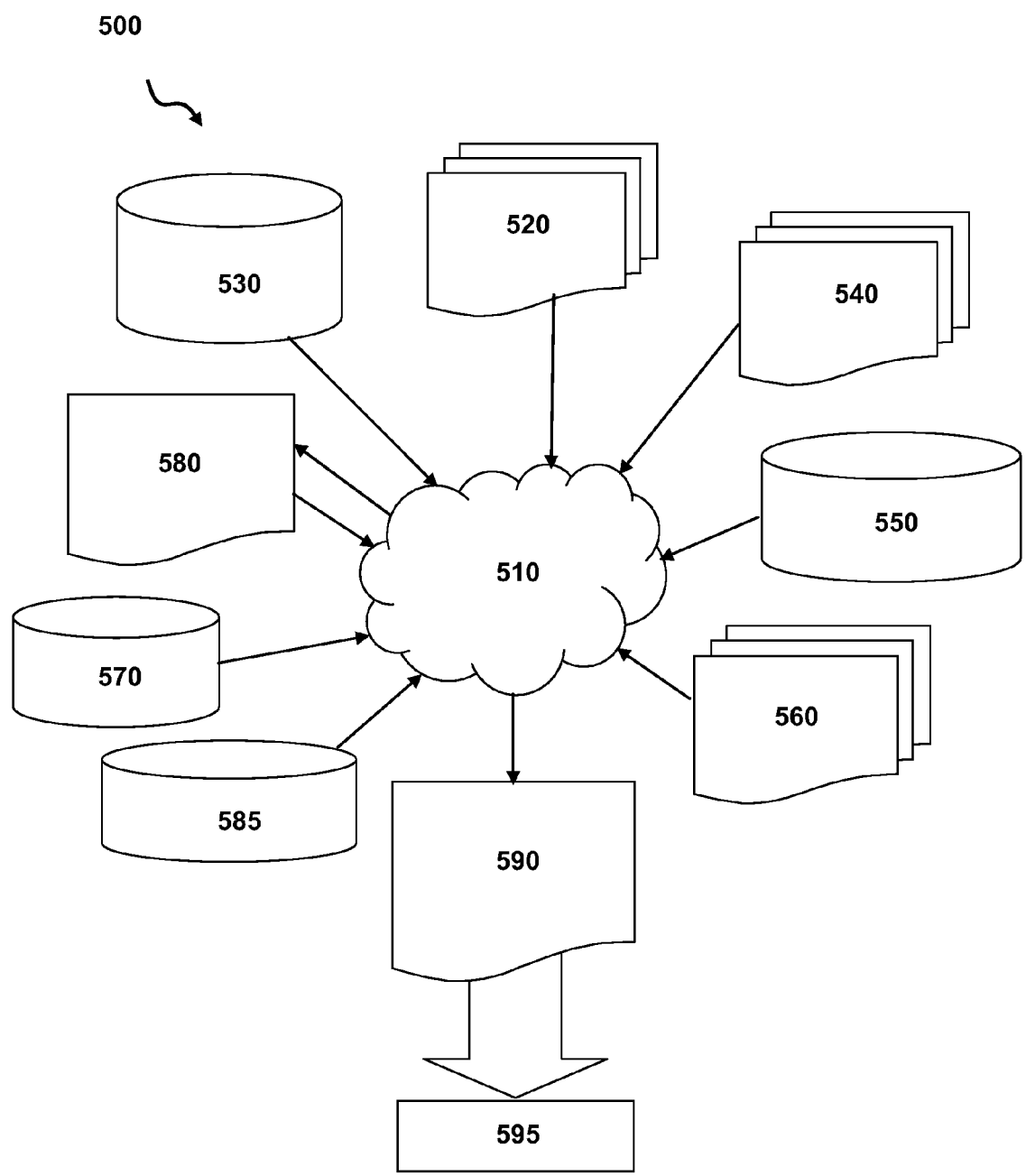
FIG. 5 is a flow diagram of a design process used in semiconductor design, manufacture, and/or test.

FIG. 5 shows a block diagram of an exemplary design flow 500 used for example, in semiconductor IC logic design, simulation, test, layout, and manufacture. Design flow 500 includes processes and mechanisms for processing design structures or devices to generate logically or otherwise functionally equivalent representations of the design structures and/or devices described above and shown in FIGS. 1-4. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system such as those shown in FIGS. 1-4. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown in FIGS. 1-4 to generate a netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4. In one embodiment, design structure 590 may comprise a compiled, executable HDL simulation model that functionally simulates the devices shown in FIGS. 1-4.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 590 may then proceed to a stage 595 where, for example, design structure 590: proceeds to tape-out, is released to manufacturing, is released to a mask house, is sent to another design house, is sent back to the customer, etc.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A fractional-N phased-lock-loop (PLL) structure comprising:
 a first circuit located on an integrated circuit, the first circuit including:
  a voltage controlled oscillator for generating a periodic output signal;
  a phase detector for controlling the voltage controlled oscillator;

a charge pump for modifying an input to the voltage controlled oscillator;
a frequency divider in a feedback path for modifying a frequency of the periodic output signal;
a first multiplexer; and
a first random number generator;
a second circuit including:
a second multiplexer; and
a second random number generator; and
an adder circuit coupled to a third multiplexer,
wherein the second circuit is a programmable circuit located off the integrated circuit and coupled to the first circuit.

2. The fractional-N PLL structure of claim 1, wherein the first circuit further includes the third multiplexer.

3. The fractional-N PLL structure of claim 2, wherein the second circuit is a field programmable gate array (FPGA).

4. The fractional-N PLL structure of claim 3, wherein a first input of the FPGA is coupled to the first random number generator.

5. The fractional-N PLL structure of claim 4, wherein a second input of the FPGA is coupled to the first multiplexer.

6. The fractional-N PLL structure of claim 5, wherein a first output of the FPGA is coupled to the third multiplexer.

7. Fractional-N phased-lock-loop (PLL) structure comprising:
a first circuit located on an integrated circuit, the first circuit including:
a voltage controlled oscillator for generating a periodic output signal;
a phase detector for controlling the voltage controlled oscillator;
a charge pump for modifying an input to the voltage controlled oscillator;
a frequency divider in a feedback path for modifying a frequency of the periodic output signal;
a first multiplexer; and
a first random number generator;
a second circuit including:
a second multiplexer; and
a second random number generator,
wherein the second circuit is a programmable circuit located off the integrated circuit and coupled to the first circuit,
wherein only one of the first or the second random number generator operates at a time.

8. The fractional-N PLL structure of claim 7, wherein at least the first and the second multiplexers are configured to switch operation between the first and the second random number generators.

9. The fractional-N PLL structure of claim 1, wherein digital circuitry of the first and the second random number generators are initially functionally the same.

10. The fractional-N PLL structure of claim 1, wherein the first and the second random number generator are a same type of random number generator.

11. The fractional-N PLL structure of claim 1, wherein the first circuit is configured to measure phase noise.

12. The fractional-N PLL structure of claim 11, wherein the second circuit is configured to measure phase noise.

13. A fractional-N phased-lock-loop (PLL) structure comprising:
a first circuit located on an integrated circuit, the first circuit including:
a voltage controlled oscillator for generating a periodic output signal;
a phase detector for controlling the voltage controlled oscillator;
a charge pump for modifying an input to the voltage controlled oscillator;
a frequency divider in a feedback path for modifying a frequency of the periodic output signal;
a first multiplexer; and
a first random number generator;
a second circuit including:
a second multiplexer; and
a second random number generator,
wherein the second circuit is a programmable circuit located off the integrated circuit and coupled to the first circuit,
wherein the first circuit is configured to measure phase noise,
wherein the second circuit is configured to measure phase noise,
wherein a first phase noise measured by the first circuit is compared to a second phase noise measured by the second circuit.

14. The fractional-N PLL structure of claim 13, wherein a main phase noise source is determined based on the comparison.

15. The fractional-N PLL structure of claim 14, wherein the first circuit is conditionally modified based on the comparison.

16. The fractional-N PLL structure of claim 15, wherein the first circuit is modified to meet technical requirements, based on the comparison.

17. The fractional-N PLL structure of claim 14, wherein the second circuit is conditionally modified based on the comparison.

18. The fractional-N PLL structure of claim 17, wherein the modification includes modifying the second random number generator to optimize performance of the fractional-N PLL structure, the optimizing including optimizing phase noise and fractional spur.

* * * * *